United States Patent
Nobuhara

Patent Number: 5,317,448
Date of Patent: May 31, 1994

[54] METHOD FOR DRIVING A LASER AMPLIFIER WITH MINIMIZED DISTORTION

[75] Inventor: Hiroyuki Nobuhara, Kawasaki, Japan

[73] Assignee: Fujitsu Limited, Kawasaki, Japan

[21] Appl. No.: 850,822

[22] Filed: Mar. 13, 1992

[30] Foreign Application Priority Data

Mar. 20, 1991 [JP] Japan .................................. 3-57427

[51] Int. Cl.$^5$ .............................................. G02F 1/00
[52] U.S. Cl. .................................................... 359/333
[58] Field of Search ............... 359/333, 334, 336, 344; 372/20

[56] References Cited

U.S. PATENT DOCUMENTS 4,736,164  4/1988  Henning .............................. 359/344

Primary Examiner—Ian J. Lobo
Attorney, Agent, or Firm—Staas & Halsey

[57] ABSTRACT

A method for controlling an optical amplifier that amplifies an input optical beam according to a characteristic curve. The characteristic curve changes depending on an optical power of the input optical beam, and the optical amplifier operates according to a first reference characteristic curve when an input optical beam having a first reference optical power level of the input optical beam, below which first reference optical power level a further reduction in the optical power level of the input optical beam does not produce any substantial change in the relationship of the optical gain of the optical amplifier as a function of a change in wave length of the input optical beam, and accordingly of the first reference characteristic curve; is supplied as a first reference optical power. Further, the optical amplifier operates according to a second reference characteristic curve when an input optical beam having a second reference optical power is supplied, wherein the second reference power is defined such that the second reference characteristic curve has a peak gain that is smaller than a peak gain of the first reference characteristic curve by three decibels. The method comprises the steps of controlling the optical power of the input optical beam equal to or smaller than the second reference optical power; and setting the wavelength of the input optical beam to fall in a range between a first reference wavelength corresponding to the peak gain of the first reference characteristic curve and a second reference wavelength corresponding to the peak gain of the second reference characteristic curve.

9 Claims, 6 Drawing Sheets

FIG. 1 PRIOR ART
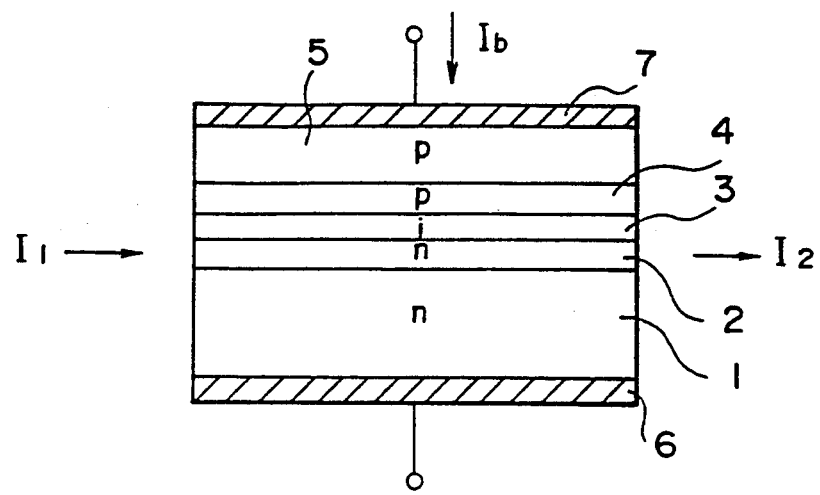
FIG. 2
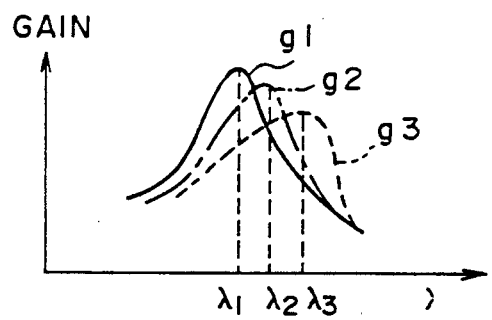
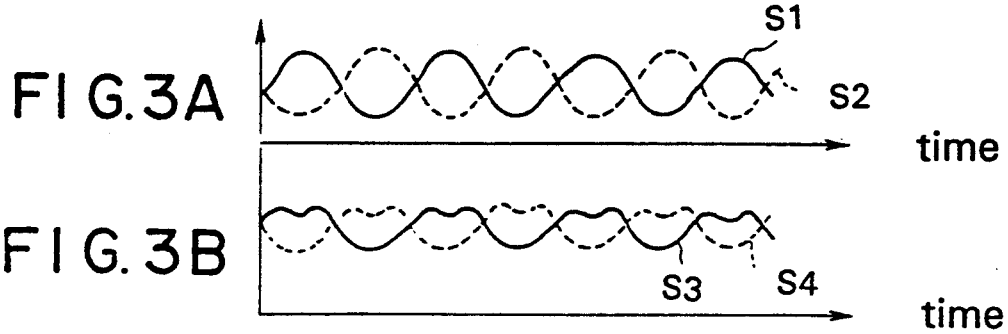
FIG. 3A
FIG. 3B

METHOD FOR DRIVING A LASER AMPLIFIER WITH MINIMIZED DISTORTION

BACKGROUND OF THE INVENTION

The present invention generally relates to optical amplification of coherent optical beams, and more particularly to a method for driving a laser amplifier such that the distortion of output optical signals is minimized.

In optical telecommunication systems, the amplification of coherent optical beams together with optical information modulated thereon is a fundamental as well as an essential process. For this purpose, various laser amplifiers have been developed so far. Particularly, semiconductor laser amplifiers that amplify the optical beam of a selected wavelength have been studied intensively in relation to optical filters for use in optical telecommunication networks that employ wavelength multiplexing of optical signals.

When using the laser diode for optical amplification, the laser diode is driven with a drive current controlled slightly below a threshold level of laser oscillation. In the laser diode biased as such, an input optical beam supplied to an active layer of the laser diode induces a stimulated emission as the optical beam travels therethrough, and a desired optical amplification is achieved. In optical amplification, the optical beam having a wavelength that matches the resonant wavelength of the laser diode is amplified selectively. Thereby, the laser amplifier acts as the optical filter with a passband wavelength coincident with the resonant wavelength of the laser diode.

In such a conventional optical amplifier/filter device, it should be noted that the passband wavelength tends to change with the amplification of the optical beam, as the increased intensity of the optical beam, caused by the optical amplification, inevitably invites a depletion of carriers in the active layer of the device due to the enhanced stimulated emission. It should be noted that the depletion of the carriers causes an increase in the refractive index in the active layer, and such a change of the refractive index in turn causes a change in the effective length of the resonator of the device. This phenomenon occurs in the laser amplifiers that use the cleaved end surfaces for the resonator as well as in the DFB laser amplifiers that use Bragg reflection for the optical resonance.

FIG. 1 shows the structure of a typical conventional laser amplifier.

Referring to FIG. 1, the device includes a semiconductor layered body that in turn includes a single crystal substrate 1 of n-type InP, and a clad layer 2 of n-type InP is grown epitaxially on the substrate 1. On the clad layer 2, an undoped active layer 3 of InGaAsP is grown epitaxially, and a clad layer 4 of p-type InGaAsP is grown further thereon. On the clad layer 4, a contact layer 5 of InP is grown epitaxially, and a p-type electrode 7 is provided on the upper major surface of the contact layer 5 as illustrated. Further, an n-type electrode 6 is provided on the lower major surface of the substrate 1. The layered body extends between an input end and an output end, and an input optical beam $I_1$ is supplied into the active layer 3 via the foregoing input end.

In operation, the device of FIG. 1 is biased by a bias current $I_b$ that is injected into the active layer 3 via the electrodes 6 and 7, wherein, unlike the usual laser diode, the level of the bias current $I_b$ is set slightly below the threshold level of the laser oscillation. When the input optical beam $I_1$ is supplied to the input end of the laser diode thus biased, the optical beam $I_1$ induces a stimulated emission of photons in response to the passage of the wavefront of the optical beam $I_1$ through the active layer 3. In other words, the optical beam $I_1$ is amplified as it travels from the input end to the output end while maintaining the coherency, and outputted from the output end as a coherent output optical beam $I_2$.

In the above-mentioned operation of the optical amplification, it should be noted that a depletion of carriers occurs in the active layer 3 along with the amplification of the optical beam. With the increased intensity of the optical radiation in the active layer 3, the recombination of the injected electrons and holes is accelerated due to the facilitated stimulated emission as already noted. Such a depletion of the carriers in turn induces a change in the refractive index of the active layer 3 in correspondence to the region where the depletion of the carriers occurs strongly, and such a change of the refractive index in turn causes a change of the effective resonant length of the resonator of the laser diode. Thus, the operational characteristic of the laser diode amplifier changes dynamically in response to the level of optical amplification occurring therein.

FIG. 2 shows the characteristic curve showing the relationship between the gain and the wavelength of the laser amplifier of FIG. 1 schematically, wherein the characteristic i.e., the gain versus wavelength relationship, curve designated as $g_1$ represents the characteristic for an infinitesimal optical input $I_1$ i.e., a threshold level of the optical power of the input optical beam below which the corresponding characteristic curve does not change substantially with further changes in the optical power of the input optical beam. As can be seen in FIG. 2, the curve $g_1$ has a peak indicative of a maximum gain in correspondence to a characteristic wavelength $\lambda_1$ that is determined by the geometrical configuration of the device of FIG. 1. When the intensity of the input optical beam $I_1$ increases, the characteristic curve shifts from the curve $g_1$ to another curve $g_2$ that has a characteristic wavelength $\lambda_2$ longer than the wavelength $\lambda_1$. When the intensity of the input optical beam increases further, the operational characteristic shifts to a curve $g_3$ having a characteristic wavelength $\lambda_3$ that is longer than either of the wavelengths $\lambda_1$ and $\lambda_2$.

The relationship of FIG. 2 implies the possibility that the operational characteristic of the optical amplifier of FIG. 1 may change dynamically when the input optical beam $I_1$ is given in the form of optical pulses as shown in FIG. 3(A).

Referring to FIG. 3(A), the curve designated as $S_1$ represents the waveform corresponding to an input data train "101010 . . . ," wherein the curve designated as $S_2$ represents the waveform corresponding to an input data train "010101 . . . " When the data "1", characterized by a positive optical pulse enters to the device of FIG. 1 as the input optical beam $I_1$ with the wavelength $\lambda_1$, it will be understood that optical amplification is achieved at the beginning in accordance with the characteristic curve $g_1$. There, an efficient optical amplification is achieved at the wavelength $\lambda_1$ in correspondence to the peak of the gain.

With the progress of the optical amplification, however, the operational characteristic changes from the curve $g_1$ to the curve $g_2$ and further to the curve $g_3$. Thereby, the gain of the device starts to decrease. As a result, there may appear a distortion in the output optical pulse as shown in waveforms $S_3$ and $S_4$ of FIG. 3(B), wherein the waveform $S_3$ represents the output optical beam $I_2$ corresponding to the input waveform $S_1$ and the waveform $S_4$ represents the output optical beam $I_2$ corresponding to the input waveform $S_2$. In the waveform $S_3$, it will be noted that there appears a dip in correspondence to the peak of the waveform $S_1$. Similarly, a dip appears in the waveform $S_4$ in correspondence to the peak of the waveform $S_2$. When such a distortion appears, the chance of the erroneous recognition of the data may increase. This problem becomes particularly acute for the high speed transmission of the data with a pulse rate of 1 GHz or more.

SUMMARY OF THE INVENTION

Accordingly, it is a general object of the present invention to provide a novel and useful method for driving a laser amplifier, wherein the foregoing problems are eliminated.

Another and more specific object of the present invention is to provide a method for driving a laser amplifier while minimizing the distortion in the output optical signal.

Another object of the present invention is to provide a method for controlling an optical amplifier, said optical amplifier amplifying an input optical beam according to a characteristic curve that describes a relationship between an optical gain and a wavelength of the input optical beam, said characteristic curve changing depending on an optical power of the input optical beam. The optical amplifier operates according to a first reference characteristic curve when said input optical beam has a first reference optical power that is equal to the maximum optical power, said first reference characteristic curve being characterized by a first reference peak gain and a first reference characteristic wavelength corresponding to said first reference peak gain. The optical amplifier operates according to a second reference characteristic curve when said input optical beam has a second reference optical power, said second reference characteristic curve being characterized by a second reference peak gain that is lower than said first reference peak gain by three decibels and a second reference characteristic wavelength corresponding to said second reference peak gain. The method controls the optical power of the input optical beam to be equal to or smaller than said second reference optical power and sets the wavelength of the input optical beam to fall in a range between said first reference wavelength and said second reference wavelength. According to the present invention, the unwanted saturation of optical amplification in the laser amplifier is avoided by suppressing the optical power of the input optical beam to an optimum range. Further, by setting the wavelength of the input optical beam as set forth above, one can achieve an effective optical amplification without causing substantial distortion. When the wavelength of the input optical beam is shorter than said first reference wavelength, on the other hand, an appreciable decrease of the optical gain would occur with an increasing amplitude of the optical signal and the output optical signal produced by the laser amplifier would be distorted. When the wavelength of the input optical beam is set longer than the second reference wavelength, on the other hand, the maximum of the optical gain becomes diffuse and the wavelength selectivity of optical amplification is lost. Only when the laser amplifier is operated in the foregoing optimum range, one can obtain an excellent wavelength selectivity and minimized distortion of the optical output.

Other objects and features of the present invention will become apparent from the following detailed description when read in conjunction with the attached drawings.

BRIEF DESCRIPTION OF THE DRAWINGS

FIG. 1 is a diagram showing a conventional laser amplifier used for an optical bandpass filter;

FIG. 2 is a diagram showing the operational characteristic of the device of FIG. 1 for various intensity levels of the input optical beam;

FIGS. 3A and 3B are diagrams showing the distortion of an output optical beam produced in the device of FIG. 1;

DETAILED DESCRIPTION OF PREFERRED EMBODIMENTS

Before describing the preferred embodiments of the present invention, description will be given for the experiment conducted by the inventor of the present invention on the laser amplifier in search of the optimum operational condition, with reference to FIGS. 4 and 5.

Figure 4:
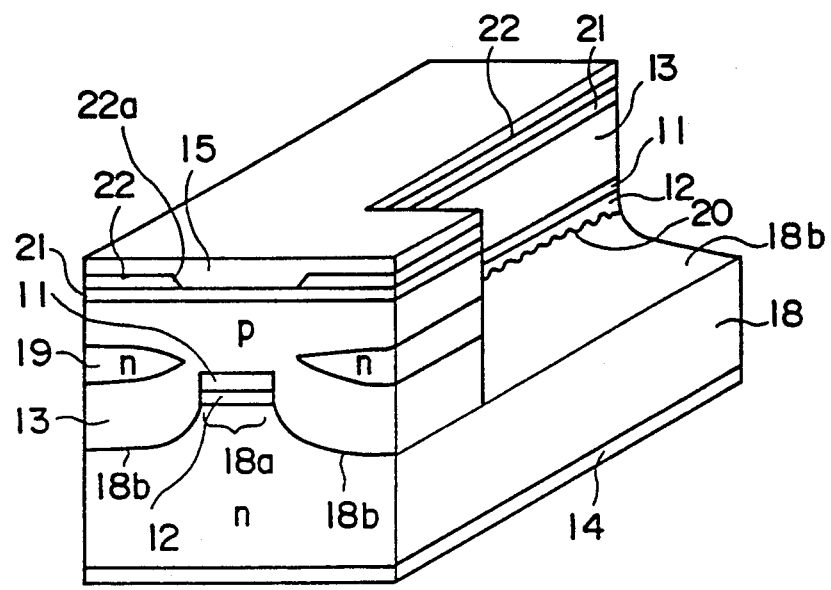
FIG. 4 is a diagram showing the structure of a laser amplifier used in the present invention for seeking the optimum operational condition wherein the distortion of the output optical beam is minimized.

Referring to FIG. 4 showing the structure of the laser amplifier used for the experiment, the laser amplifier includes a substrate 18 of n-type InP. The substrate 18 has a mesa structure 18a defined laterally by a pair of sloped surfaces 18b, wherein the mesa structure 18a has an upper major surface extending in a longitudinal direction of the optical amplifier like a strip with a lateral width of 1000 nm.

On the upper major surface of the mesa structure 18a, a diffraction grating 20 is provided as usual in the DFB laser diodes, with the pitch of corrugation being 240 nm. Of course, the pitch of corrugation is determined in correspondence to the wavelength of the optical beam to be amplified by the laser amplifier. The foregoing pitch is selected for the optical amplification of an optical beam having a wavelength of about 1.55 um.

On the corrugation of diffraction grating 20, a wavelength layer 12 of n-type InGaAsP is formed epitaxially in a thickness of 50 nm and of composition such that the waveguide layer 12 has a band gap slightly larger than the energy level of the optical beam to be amplified by the device. When amplifying an optical beam having a wavelength of about 1.55 μm, the composition of the layer 12 is set to $In_{0.82}Ga_{0.18}As_{0.79}P_{0.21}$. In this case, the band gap of the layer 12 corresponds to the wavelength of 1.1 μm. On the waveguide layer 12, an active layer 11 of undoped InGaAsP is formed in a thickness of 150 nm and of composition of $In_{0.65}Ga_{0.35}As_{0.79}P_{0.21}$ in correspondence to the wavelength of 1.55 μm.

In the actual fabrication process, the grating 20 is formed on the entire upper major surface of the substrate 18, to extending in the longitudinal direction of the laser amplifier, and the waveguide layer 12, as well as the active layer 11, are grown successively on the corrugated upper major surface of the substrate 18. After the active layer 11 is formed, the mesa structure 18a is formed by an etching process such that the active layer 11 and the waveguide layer 12 extend in the longitudinal direction of the laser amplifier in correspondence to the strip-like pattern of the mesa region 18a.

The active layer 11 and the waveguide layer 12 thus formed are then buried under a clad layer 13 of p-type InP, wherein the clad layer 13 is grown on the sloped surfaces 18b of the substrate 18 epitaxially. The clad layer 13 typically has a thickness of 1500 nm in correspondence to the part located immediately above the active layer 11. Further, a pair of n-type regions 19 are formed in the clad layer 13, in opposed relationship and spaced from each other, on opposite sides of the active layer 11, for confining the flow of carriers as usual.

On the upper major surface of the clad layer 13, a contact layer 21 of p-type InGaAsP is grown epitaxially with a composition of $In_{0.76}Ga_{0.24}As_{0.55}P_{0.45}$ and a thickness of 200 nm, and a silicon oxide film 22 is provided further thereon with a window 22a formed therein to expose the upper major surface of the contact layer 21. On the upper major surface of the silicon oxide film 22, an electrode layer 15 is formed in ohmic contact with the exposed upper major surface of the contact layer 21 via the window 22a. Further, another electrode layer 14 is provided on a lower major surface of the substrate 18.

Figure 5:
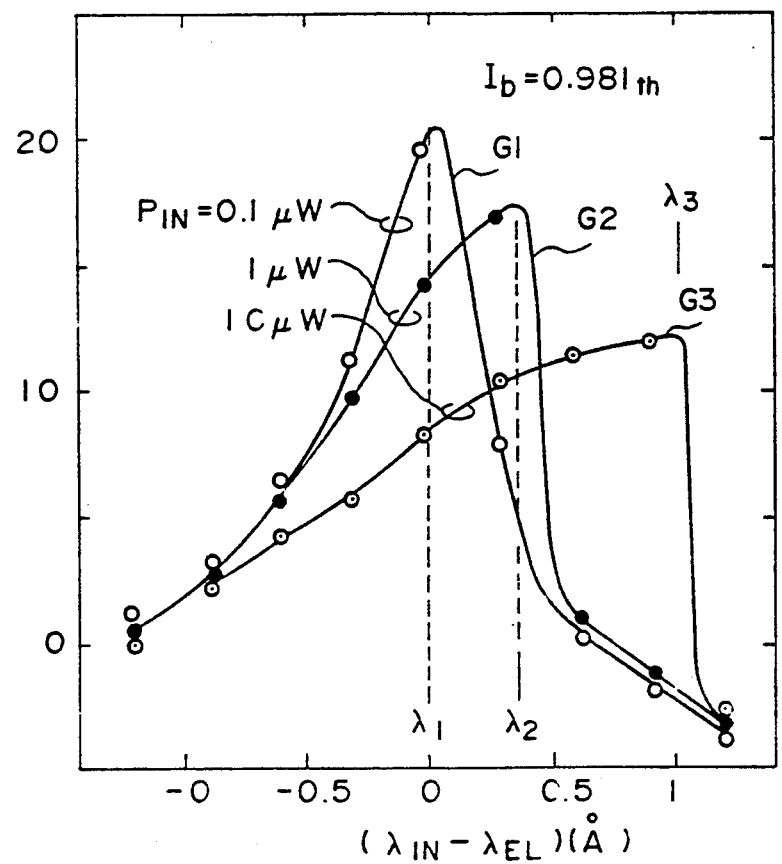
FIG. 5 is a diagram similar to FIG. 2 showing the operational characteristics of the device of FIG. 4.

FIG. 5 shows the operational characteristics of the laser amplifier of FIG. 4. In operation, the laser amplifier is driven by a bias current $I_b$ set to 0.98 times the threshold current $I_{TH}$ of laser oscillation ($I_b = 0.98\ I_{TH}$) More specifically, FIG. 5 shows the relationship between the optical gain and the wavelength of the optical beam to be amplified for various intensities of the input optical beam. As the bias current $I_b$ is set below the threshold current $I_{TH}$, the laser amplifier does not cause spontaneous laser oscillation. In FIG. 5, it should be noted that the horizontal axis represents an offset of wavelength measured from a reference wavelength. As will be described below, the reference wavelength is set to be coincident with a wavelength $\lambda_1$ that corresponds to the peak of a characteristic curve $G_1$. In the present case, the reference wavelength $\lambda_1$ is set to 15320 Å.

Referring to FIG. 5, the characteristic curve $G_1$ represents the operational characteristic for the optical beam having the minimum optical power of 0.1 μW and hence corresponds to the curve $g_1$ of FIG. 2 for the infinitesimal input optical power. For this reason, the curve $G_1$ will be referred to here also as a reference curve. On the other hand, the curve $G_2$ corresponds to the curve $g_2$ of FIG. 2 and represents the operational characteristic for the optical beam having an optical power of 1 μW. Further, the curve designated by $G_3$ corresponds to the curve $g_3$ and represents the operational characteristic for the optical beam having the optical power of 10 μW.

As can be seen in FIG. 5, each of the characteristic curves has a peak corresponding to the maximum gain and a characteristic wavelength ($\lambda_1$, $\lambda_2$, $\lambda_3$) that corresponds to the maximum gain. Thus, when an optical beam having an infinitesimal intensity is supplied to the active layer 11 of FIG. 4 for optical amplification, the optical component with the wavelength of $\lambda_1$ is amplified selectively. When an optical beam having a medium intensity in the order of 1 μW is supplied, on the other hand, the optical component having the wavelength of $\lambda_2$ is amplified selectively. Similarly, when an optical beam having a large intensity in the order of 10 μW is supplied, the optical component having the wavelength of $\lambda_3$ is amplified selectively. Further, when an optical pulse train as shown in FIG. 3(A) is supplied, the operational characteristics changes dynamically from the curve $G_1$ to the curve $G_2$ and from the curve $G_2$ to the curve $G_3$ with increasing amplitude of the optical pulse. Therefore, the problem of distortion explained with reference to FIG. 3(B) arises.

The inventor of the present invention has conducted a number of experiments, using the device of FIG. 4, for measuring the output waveform of the optical pulses produced by the laser amplifier while varying the power and wavelength of the input optic pulses.

During the experiment, the device of FIG. 4 was biased with the bias current $I_b$ as set forth before, and the input optical pulses are supplied to the active layer 11 at a first longitudinal end with a bit rate of 5 GB/sec. There, each optical pulse had a pulse width of 200 psec, and the output optical pulses produced in response to the input optical pulses were detected. The output optical pulses are outputted from the active layer 11 at a second, opposing longitudinal end after the optical amplification. The device used for the experiment had the longitudinal size of about 0.3 mm between the first and second longitudinal ends.

Figure 6:
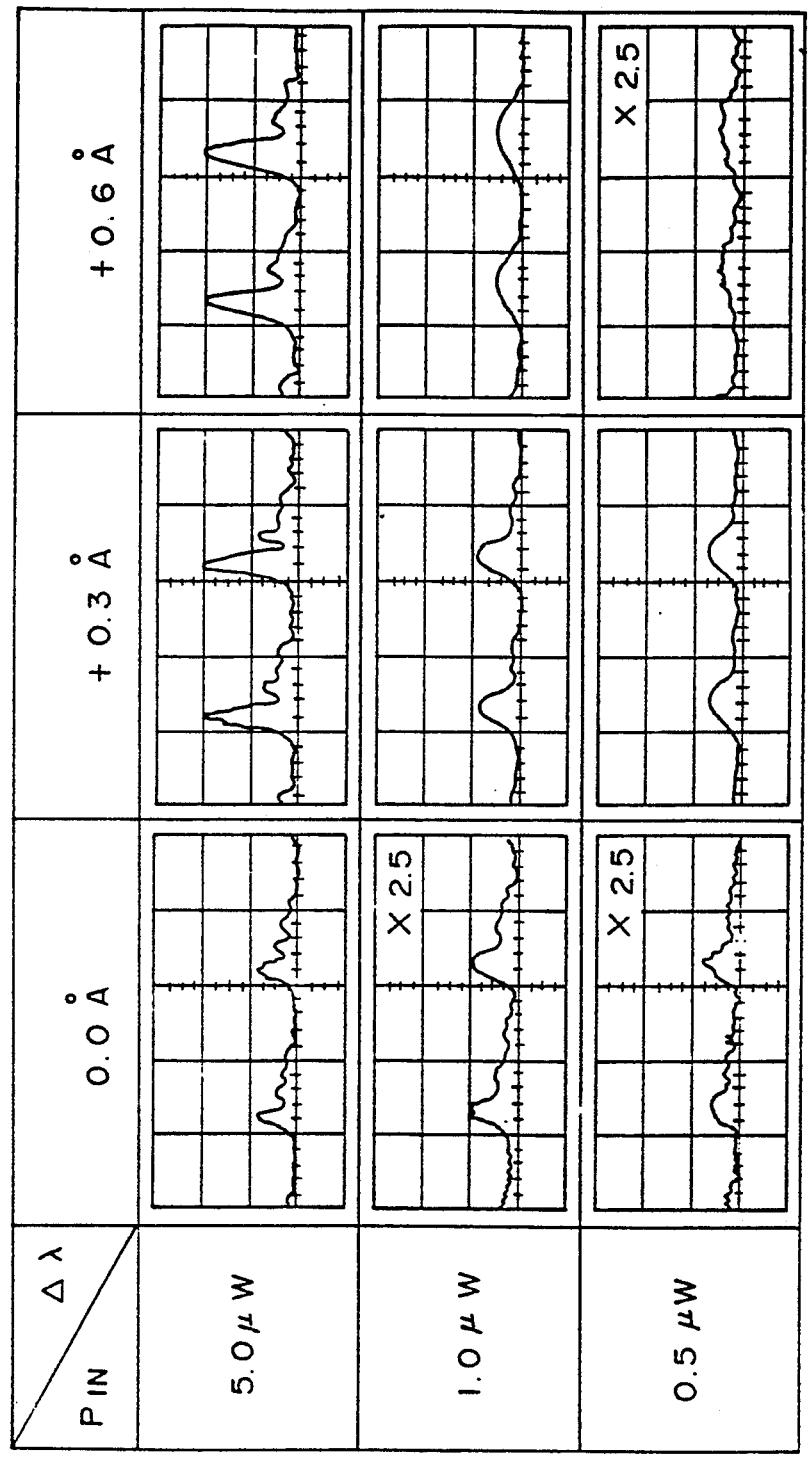
FIG. 6 is a diagram showing the results of experiments conducted on the device of FIG. 4 while changing the operational condition.

FIG. 6 shows the waveform of the output optical pulses, obtained as a result of the optical amplification, for various combinations of the input optical power and wavelengths. More particularly, the measurement was made for various combinations of the optical power settings of 0.5 μW, 1.0 μW and 5.0 μW and the wavelength offsets of 0.0 Å, +0.3 Å and +0.6 Å, wherein the wavelength offset is measured, of course, from the aforementioned reference wavelength $\lambda_1$.

Referring to FIG. 6, it will be seen that the output optical pulses show a substantial distortion for all the wavelength settings of the input optical pulse as long the optical power of the input optical pulse is set to 5.0 μW or more. Further, in the case where the wavelength is set coincident to with the reference wavelength $\lambda_1$, it was observed that an appreciable distortion appears even when the power of the input optical pulse is reduced to the level of 0.5 μW.

When the wavelength was set longer than the reference wavelength by +0.3 Å, on the other hand, it was discovered that the distortion can be reduced substantially by setting the optical power at a level of 1.0 μW or less. Particularly, when the optical power is set at 0.5 μW, no appreciable distortion was recognized. In other words, it was found that a substantially distortion-free optical amplification can be achieved by setting the power of the input optical beam below about 1.0 μW and by setting the wavelength of the optical beam to be longer than the reference wavelength by +0.3 Å. It should be noted that the wavelength of the input optical beam for this case corresponds to the wavelength $\lambda_2$ of FIG. 5. It should be noted further that the operational point which provides the waveform of FIG. 6 for the combination of the input optical power of 1.0 μW and the wavelength offset of +0.3 Å, corresponds to the peak of the curve $G_2$ of FIG. 5. Hereinafter, the characteristic curve $G_2$ will be referred to also as a second reference curve.

When the wavelength offset is set to +0.6 Å, on the other hand, one cannot obtain sufficient gain for the optical output pulses having a small power, as can be seen in the combination of the power of 0.5 μW and the wavelength offset of +0.6 Å. In this regard, reference should be made also to the characteristics diagram of FIG. 5. In FIG. 5, it will be seen that the optical gain drops sharply when the wavelength offset of the optical input exceeds about +0.5 Å, unless the power of the optical input increases significantly to the level of about 10 μW or more. Of course, such a large amplitude optical input is unacceptable in view of the large distortion as demonstrated in the result of FIG. 6.

Summarizing the above discovery, it is concluded that, by setting the wavelength of the input optical pulses between the reference wavelength $\lambda_1$, corresponding to the peak of the first reference curve $G_1$, and another reference wavelength $\lambda_2$, corresponding to the peak of the second reference curve $G_2$, and by setting the power of the input optical pulses to be equal to or smaller than the optical power of 1.0 μW, which corresponds to the optical power for the second reference curve $G_2$, one can achieve optical amplification without substantial distortion, while maintaining wavelength selectivity. In FIG. 6, it should be noted that the peak of the second reference curve $G_2$ corresponds to the optical gain of about 17.5 dB that is 3 dB smaller than the gain of about 20.5 dB for the peak of the first reference curve $G_1$. Therefore, the peak gain of the second reference curve $G_2$ is about one-half the peak gain of the first reference curve $G_1$.

Figure 7:
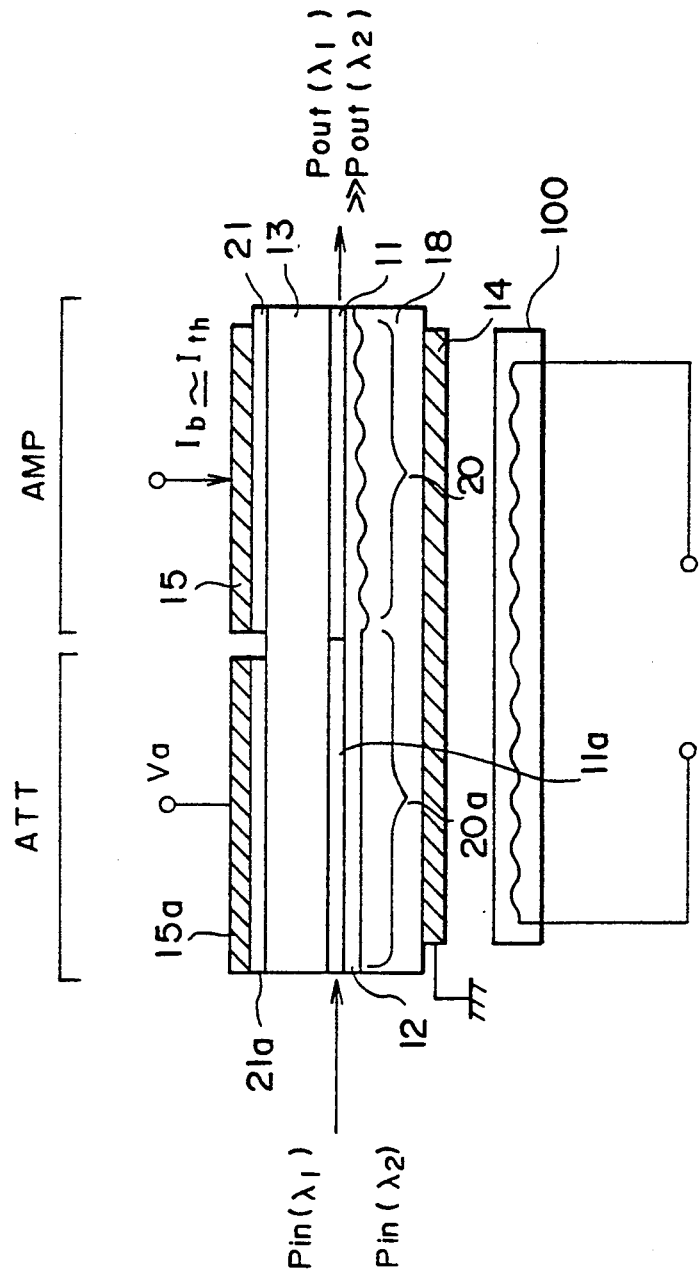
FIG. 7 is a diagram showing the optical amplification and filtering according to a first embodiment of the present invention.

Next, a first embodiment of the present invention will be described with reference to FIG. 7 showing a laser amplifier that is controlled according to the aforementioned principle.

Referring to FIG. 7, the device is formed from an amplifier part designated as AMP and an attenuator part designated as ATT, wherein the device is constructed on the n-type InP substrate 18, similarly to the device of FIG. 4. The device has an end view similar to the end view of FIG. 4, characterized by the mesa structure 18a and the sloped lateral surfaces 18b. On the mesa structure 18a, the waveguide layer 12 of the aforementioned composition of $In_{0.82}Ga_{0.18}As_{0.40}P_{0.60}$ is grown similarly to the device of FIG. 4, except that the layer 12 consists of a first part wherein the diffraction grating 20 is provided and a second part 20a wherein the diffraction grating 20 is not provided. Further, the electrode layer 14 is provided on the lower major surface of the substrate 18.

On the aforementioned first part of the waveguide layer 12, the active layer 11 of the composition. $In_{0.65}Ga_{0.35}As_{0.79}P_{0.21}$ is grown similarly as in the device of FIG. 4. On the other hand, an absorption layer 11a of undoped InGaAsP having a composition of $In_{0.72}Ga_{0.28}As_{0.64}P_{0.36}$ is grown on the layer 12 in correspondence to the second part 20a. With the foregoing composition, the absorption layer 11a produces an absorption of the optical beam having a wavelength of about 1.4 μm when there is no external electric field applied.

The waveguide layer 12 and the active layer 11 as well as the absorption layer 11a are buried under the p-type InP clad layer 13, similarly as in the device of FIG. 4, and the contact layer 21 is provided on the upper major surface of the clad layer 13 in correspondence to the part where the active layer 11 is provided. Further, the electrode 15 is provided on the contact layer 21. Thereby, the amplifier part AMP of the device of FIG. 7 acts as a laser amplifier, similarly to the device of FIG. 4.

In the device of FIG. 7, another contact layer 21a of the same composition as the contact layer 21 is provided on the clad layer 13 in correspondence to the absorption layer 11a. The contact layer 21a is separated from the contact layer 21 and enables the driving of the attenuation part ATT of the device independently from the amplifier part AMP. On the contact layer 21a, an electrode 15a is provided, separated from the electrode 15. A more complete description of the attenuation part ATT can be found in the European Patent Application Laid-open Publication EP-A-O 411 145, which is incorporated herein by reference.

Further, the device of FIG. 7 includes a heating fixture 100 for heating the device thereby controlling the temperature of the device. By doing so, one can shift the operational characteristics of FIG. 5 along the wavelength axis, thereby tuning the optical amplification.

In operation, the bias current $I_b$ set slightly below the threshold current $I_{TH}$, is supplied to the electrode 15 and the laser amplifier AMP is biased so as to be ready for optical amplification. Further, a reverse bias voltage $V_a$ is applied across the electrodes 14 and 15a to establish a large electric field across the absorption layer 11a. When such a large electric field is applied, the layer 11a exhibits the Franz-Keldysh effect wherein the optical absorption wavelength shifts toward the longer wavelength side by the penetration of the wave function of carriers into the forbidden band. Thereby, the absorption layer 11a, having the absorption wavelength of about 1.4 μm, starts to exhibit the optical absorption of the optical beam of the wavelength of 1.55 μm, as shown in FIG. 8.

Figure 8:
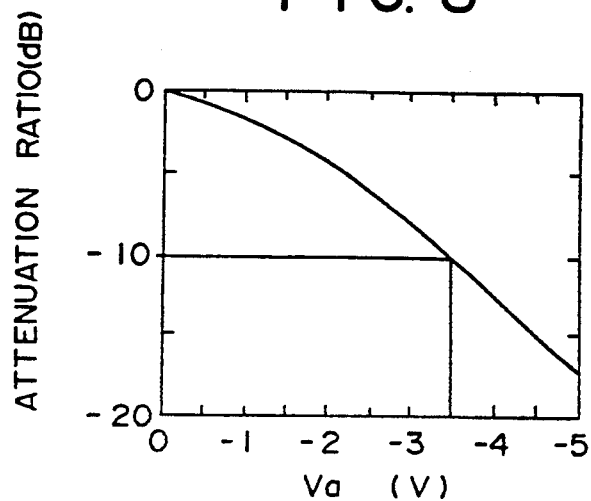
FIG. 8 is a diagram showing the attenuation of input optical beam used in the embodiment of FIG. 7.

Referring to FIG. 8, a negative voltage is applied to the electrode 15a as the voltage $V_a$, causing the reverse biasing of the attenuator part ATT. It will be seen that the attenuation increases with increasing magnitude of the voltage $V_a$.

The input optical beam is supplied to the amplifier part AMP via the attenuator ATT as shown in FIG. 7. There, the optical beam designated as $P_{in}(\lambda_1)$ represents an input optical beam having a wavelength that is located in the band wherein the laser amplifier of the amplifier part AMP shows a large gain, while the optical beam designated as $P_{in}(\lambda_2)$ represents an input optical beam having a wavelength that is located in the band wherein the laser amplifier shows a reduced gain.

Figure 9:
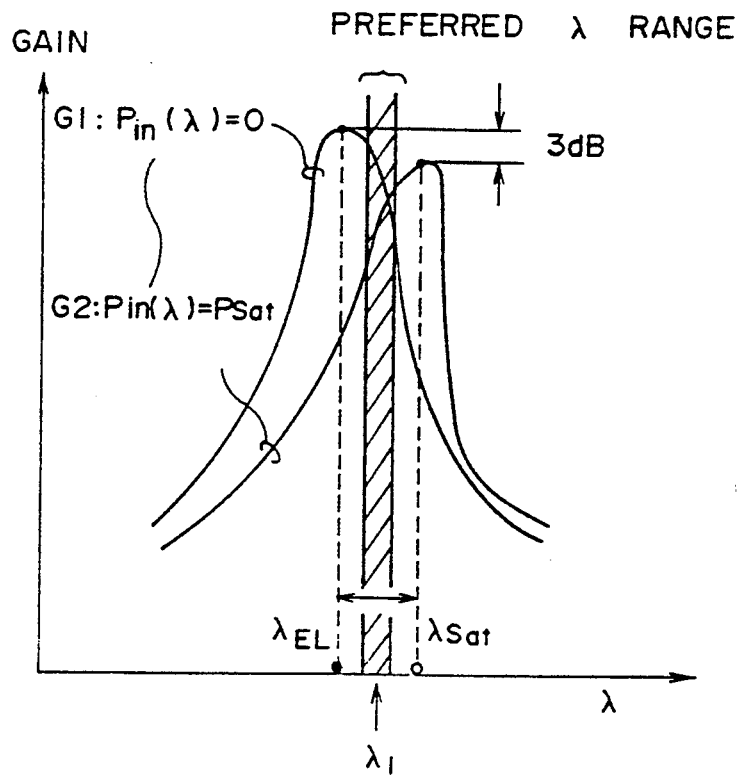
FIG. 9 is a diagram showing the optimum operational condition of the device of FIG. 7.

FIG. 9 shows the operational characteristic of the device of FIG. 7. In FIG. 9, the characteristic curve designated $G_1$ corresponds to the characteristic curve $G_1$ of FIG. 5 and represents the optical gain-wavelength relationship for the infinitesimal input optical power level. Thereby the curve $G_1$ defines a first reference curve characterized by a first reference wavelength $\lambda_{EL}$, which corresponds to the peak gain of the curve $G_1$. FIG. 9 further shows the characteristic curve designated as $G_2$ that corresponds to the characteristic curve $G_2$ of FIG. 5. This curve $G_2$ is characterized by the peak gain that is lower by 3 dB than the peak gain of the first reference curve $G_1$ and serves for a second reference curve. In correspondence to the peak of the second reference curve $G_2$, a second reference wavelength $\lambda_{sat}$ is defined. Further, it should be noted that the second reference curve $G_2$ defines an optical power that is pertinent to the curve $G_2$.

In operation, the heating fixture 100 is driven such that the wavelength $\lambda_1$ of the input optical beam $P_{in}$ falls in a band defined between the first reference wavelength $\lambda_{EL}$ and the second reference wavelength $\lambda_{sat}$. It should be noted that the heating fixture 100 causes a change in the temperature of the device, and the change in the temperature in turn causes a parallel shift of the characteristic curve in the wavelength axis, as already noted. Further, the bias voltage $V_a$ applied to the attenuator ATT is controlled such that the optical beam incident to the amplifier part AMP has an optical power equal to or smaller than the optical power pertinent to the second reference curve $G_2$. By setting the optical power and the wavelength as such, one can minimize the distortion of the optical signals while maintaining a sufficient optical gain.

It should be noted that, when the input optical beam has the wavelength $\lambda_2$ that is outside the foregoing band, the optical gain achieved by the optical amplification by the amplifier part AMP is substantially reduced. Thereby, the optical power of the output optical beam $P_{out}(\lambda_2)$ becomes substantially smaller than the optical power of the output optical beam $P_{out}(\lambda_1)$. Here, the output optical beam $P_{out}(\lambda_1)$ corresponds to the optical output obtained by the amplification of the input optical beam $P_{in}(\lambda_1)$ and the output optical beam $P_{out}(\lambda_2)$ corresponds to the optical output obtained by the amplification of the input optical beam $P_{in}(\lambda_2)$. In other words, the optical amplifier of FIG. 7 shows an excellent wavelength selectivity for the input optical beam.

Particularly, the range of the wavelength shown by a shaded band in FIG. 9 is preferred for achieving the wavelength selectivity and the minimized distortion. It should be noted that the shaded band of FIG. 9 has a width of about ⅓ of the band between the wavelength $\lambda_{EL}$ and the wavelength $\lambda_{sat}$ and located generally at the center between $\lambda_{EL}$ and $\lambda_{sat}$. In the shaded band, it will be seen that the change of optical gain with the progress of optical amplification is minimized.

Figure 10:
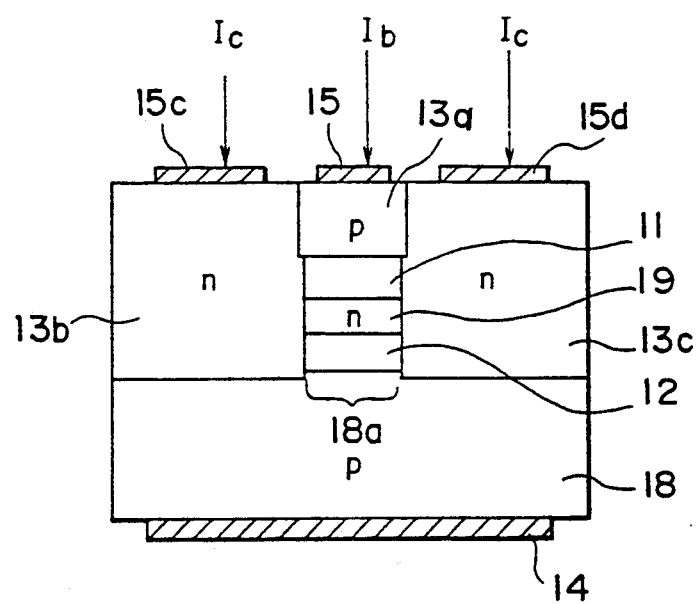
FIG. 10 is a diagram showing a second embodiment of the present invention.

FIG. 10 shows a second embodiment of the present invention, wherein only the essential parts of the device is illustrated.

Referring to FIG. 10, showing the transversal cross section of the device corresponding to the amplifier part of FIG. 7, the substrate 18 is formed with a mesa structure 18a, similar to the structure of FIG. 4, and the waveguide layer 12 is grown thereon. On the waveguide layer 12, a second waveguide 19 of n-type InGaAsP having a composition identical to that of the waveguide layer 12 is grown epitaxially, and the active layer 11 is grown on the second waveguide layer 19. Further, a clad layer 13a of p-type InP is provided on the active layer 11 with the composition identical to that of the composition of the clad layer 13.

Unlike the clad layer 13, the clad layer 13a is confined laterally to form a strip-like structure in correspondence to the mesa structure 18a. Both sides of the strip-like structure, which include the active layer 11 and both waveguide layers 12 and 19 in addition to the clad layer 13a, are confined by a pair of clad layers 13b and 13c, both of n-type InP, and electrodes 15c and 15d are provided on the clad layers 13b and 13c, respectively.

In this structure, one can inject carriers into the waveguide layer 12 via the n-type clad layers 13b and 13c by supplying a bias current $I_c$ to the electrodes 15c and 15d. It should be noted that the bias current $I_c$ is supplied independently of the bias current $I_b$ in the structure of FIG. 10. Thereby, one can control the refractive index of the waveguide layer 12 as desired. By controlling the refractive index of the waveguide layer 12 as such, the reference curves $G_1$ and $G_2$ of FIG. 9 can be shifted such that the wavelength $\lambda_1$ of the input optical beam falls in the band between the wavelengths $\lambda_{EL}$ and $\lambda_{sat}$.

The present invention is not limited to the embodiments described heretofore, but various variations and modifications may be made without departing from the scope of the invention.

What is claimed is:

1. A method for controlling an optical amplifier, said optical amplifier amplifying an input optical beam in accordance with an optical gain which varies as a function of both change in wavelength and a change in power level of the input optical beam, within a range of wavelengths and a range of power levels, respectively, within which the optical amplifier is operable, the relationship between the variation in optical gain with respect to wavelength of the input optical beam within the operable wavelength range defining for a fixed power level of the input optical beam within the operable power level range, a corresponding, fixed characteristic curve and defining for power levels varying throughout the operable power level range respectively corresponding, varying characteristic curves, each fixed characteristic curve defined a corresponding, fixed characteristic peak gain and a respective, fixed characteristic wavelength, said method comprising:

determining a first reference optical power level of the input optical beam, and thereby a corresponding first reference characteristic curve, below which first reference optical power level a further reduction in the optical power level of the input optical beam does not produce any substantial change in the relationship of the optical gain of the optical amplifier as a function of a change in wavelength of the input optical beam and accordingly of the first reference characteristic curve;

defining, in accordance with the first reference characteristic curve, a corresponding first reference peak gain and a respective, first reference characteristic wavelength;

determining a second reference optical power level of the input optical beam, greater than the first reference optical power level, at which the corresponding second reference characteristic curve has a corresponding, second reference peak gain which is lower than the first reference peak gain by approximately three decibels and defines a respective second reference characteristic wavelength;

limiting the variable optical power level of the input optical beam to a range having a maximum level equal to the second reference optical power level; and limiting the variable wavelength of the input optical beam to a reference range between the first and second reference wavelengths.

2. The method as claimed in claim 1 wherein said step of limiting the wavelength of the input optical beam comprises a step of tuning the optical amplifier such that the wavelength of the input optical beam falls within said reference range.

3. The method as claimed in claim 2, wherein the optical gain of the optical amplifier further varies as a function of the operational temperature of the optical amplifier, and said step of tuning the optical amplifier further comprise changing the operational temperature of the optical amplifier such that the wavelength of the input optical beam falls within said reference range.

4. The method as claimed in claim 2, wherein the optical amplifier has an input end for receiving the input optical beam and output end for emitting the amplified optical beam and an optical path extending from the input end to the output end and having a variable refractive index, said step of tuning the optical amplifier further comprising the refractive index of the optical path in the optical amplifier.

5. The method as claimed in claim 1, wherein said step of limiting the wavelength of the input optical beam comprises a step of limiting said reference range to extend from said first reference wavelength to a wavelength of 0.3 Å greater than the first reference wavelength.

6. The method as claimed in claim 1, wherein said step of limiting the wavelength of the input optical beam further comprises limiting the wavelength of the input optical beam to fall within a band of wavelengths having a width of approximately one-third of said reference range and located generally at a center of said reference range.

7. The method as claimed in claim 1, wherein said step of controlling the optical power comprises the steps of:
   cascading an optical attenuator with said optical amplifier; and
   attenuating the input optical beam by passing the input optical beam through the optical attenuator prior to entering the optical amplifier.

8. The method as claimed in claim 1, wherein said step of controlling the optical power comprises a step of limiting the optical power of the input optical beam to not greater than 1 ∞W.

9. The method as claimed in claim 1, wherein said optical amplifier amplifies the input optical beam as a result of a stimulated emission caused by passage of the input optical beam through the optical amplifier, said method further comprising a step of biasing the optical amplifier by a drive current set to a level slightly below a threshold level above which the optical amplifier initiates laser oscillation.

* * * * *

UNITED STATES PATENT AND TRADEMARK OFFICE
CERTIFICATE OF CORRECTION

PATENT NO. : 5,317,448
DATED : May 31, 1994
INVENTOR(S) : Hiroyuki NOBUHARA

It is certified that error appears in the above-indentified patent and that said Letters Patent is hereby corrected as shown below:

Column 2, line 29, delete "i.e., the gain versus wavelength relation-";

line 30, delete "ship,"; after "characteristic" insert --i.e., the gain versus wavelength relationship,--; after "$I_1$" insert --,--;

line 57, after "pulse" insert --,--;

Column 3, line 2, after "pulse" insert --,--;

line 35, change "maximum" to --minimum--.

Column 4, line 25, after "Fig. 4" insert --,--;

Column 5, line 7, delete "to";

line 41, after "($I_b$ = 0.98 $I_{TH}$)" insert --.--;

line 59, change "hére" to --hereinafter--.

Column 6, line 23, change "optic" to --optical--;

line 29, after "pulses" insert --,--;

line 30, after "pulses" insert --,--;

line 47, change "pulse" to --pulses,--;

line 48, before "the" (first occurrence) insert --as--;

line 50, delete "to";

line 68, after "Fig. 6" insert --,--.

Column 7, line 57, after "composition" delete ".";

Column 8, line 21, after "device" insert --and--;

line 25, after "$I_b$" insert --,--;

line 66, change "for" to --as--.

UNITED STATES PATENT AND TRADEMARK OFFICE
CERTIFICATE OF CORRECTION

PATENT NO. : 5,317,448
DATED : May 31, 1994
INVENTOR(S) : Hiroyuki NOBUHARA

It is certified that error appears in the above-indentified patent and that said Letters Patent is hereby corrected as shown below:

Column 10, line 62, after "claim 1" insert --,--.

Column 11, line 3, change "comprise" to --comprises--;

line 12, after "comprising" insert --controlling--.

Column 12, line 14, change " " to -- --.

Signed and Sealed this

Eighteenth Day of October, 1994

Attest:

BRUCE LEHMAN

Attesting Officer       Commissioner of Patents and Trademarks